US010204186B2

(12) United States Patent
Marwah et al.

(10) Patent No.: US 10,204,186 B2
(45) Date of Patent: Feb. 12, 2019

(54) PROVIDING A MODEL OF IMPACT OF A COOLING INFRASTRUCTURE

(75) Inventors: Manish Marwah, Palo Alto, CA (US); Cullen E. Bash, Los Gatos, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 1002 days.

(21) Appl. No.: 14/403,386

(22) PCT Filed: May 25, 2012

(86) PCT No.: PCT/US2012/039694
§ 371 (c)(1), (2), (4) Date: Nov. 24, 2014

(87) PCT Pub. No.: WO2013/176681
PCT Pub. Date: Nov. 28, 2013

(65) Prior Publication Data

US 2015/0169797 A1 Jun. 18, 2015

(51) Int. Cl.

| | |
|---|---|
| ***G06G 7/48*** | (2006.01) |
| ***G06F 17/50*** | (2006.01) |
| ***G06F 1/20*** | (2006.01) |
| ***H05K 7/20*** | (2006.01) |
| ***G05D 23/19*** | (2006.01) |
| ***G06K 9/62*** | (2006.01) |

(52) U.S. Cl.
CPC ..... *G06F 17/5009* (2013.01); *G05D 23/1917* (2013.01); *G06F 1/206* (2013.01); *G06K 9/6219* (2013.01); *H05K 7/20836* (2013.01)

(58) Field of Classification Search
CPC .......................... G06F 17/5009; G06F 17/5018
USPC .......................................................... 703/6, 7
See application file for complete search history.

(56) References Cited

U.S. PATENT DOCUMENTS

| | | | | |
|---|---|---|---|---|
| 7,558,649 | B1 | 7/2009 | Sharma et al. | |
| 7,894,943 | B2 * | 2/2011 | Sloup | G05B 17/02 165/257 |
| 8,397,088 | B1 * | 3/2013 | Ghose | G06F 1/206 713/300 |
| 8,429,434 | B2 * | 4/2013 | Hayashi | G06F 1/206 702/130 |
| 9,612,591 | B2 * | 4/2017 | Sloop | G05B 15/02 |
| 2006/0206291 | A1 | 9/2006 | Bash et al. | |
| 2006/0288967 | A1 | 12/2006 | Joyce et al. | |
| 2010/0223009 | A1 | 9/2010 | Anderson et al. | |
| 2012/0072030 | A1 | 3/2012 | Elliott | |
| 2012/0072039 | A1 | 3/2012 | Elliott | |
| 2012/0078438 | A1 * | 3/2012 | Navas | F24F 11/0001 700/300 |

(Continued)

OTHER PUBLICATIONS

Andrew Kusiak et al; Cooling output optimization of an air handling unit; Applied Energy 87 (2010); pp. 901-909.

(Continued)

*Primary Examiner* — Andy Ho
(74) *Attorney, Agent, or Firm* — Trop, Pruner & Hu, P.C.

(57) ABSTRACT

A model is provided that produces predicted sensor data as a function of at least one input feature that includes an adjustable setting of a cooling infrastructure. The model is able to model a non-linear relationship between the predicted sensor data and the adjustable setting.

18 Claims, 6 Drawing Sheets

200 222 CONTROLLER MODELS 224 202 204 218 220 212 214 206 208 210 207 216

COLD AIR HOT AIR VENT TILES

(56) References Cited

U.S. PATENT DOCUMENTS

2012/0116608 A1 5/2012 Park et al.
2017/0206615 A1* 7/2017 Sloop .................... G06Q 50/06

OTHER PUBLICATIONS

Andrew Kusiak et al; Modeling and optimization of HVAC energy consumption; Applied Energy 87 (2010) pp. 3092-3102.
Rongliang Zhou et al; Modeling and control for cooling management of data centers with hot aisle containment; ASME 2011; pp. 1-8.
Andrew Kusiak et al, Cooling output optimization of an air handling unit; Applied Energy 87 (2010), 9 Pgs.
Andrew Kusiak et al, Modeling and optimization of HVAC energy consumption; Applied Energy 87 (2010), 11 Pgs.
European Patent Office, 4 Month Office Action, dated Jan. 18, 2017, 9 Pgs., EP Application 12877499.9.
Leo Breiman, Statistical Modeling; The Two Cultures, 2001, vol. 16, 33 Pgs.
Rongliang Zhou et al, Modeling and Control for Cooling Management of Data Centers With Hot Aisle Containment; ASME Nov. 11-17, 2011, 8 Pgs.
Bash et al., Dynamic Thermal Management of Air Cooled Data Centers, IEEE 2006 (8 pages).
Breiman, Leo, Random Forests, Statistics Department, University of California, Jan. 2001 (33 pages).
Christopher M. Bishop, Pattern Recognition and Machine Learning, Feb. 2006 (749 pages) (Book).
Hastie, et al., The Elements of Statistical Learning—Data Mining, Inference, and Prediction, Springer rediction, Springer Series in Statistics, Second Edition, Aug. 2008 (758 pages) (Book).
Hongfei Li, et al., A Statistical Approach to Thermal Zone Mapping, IPACK2011-52194, Jul. 2011, Proc—ASME 2011 Pacific Rim Technical Conference & Exposition (6 pages).
Pot Search Report/Written Opinion—Application No. PCT/US2012/039694 dated Feb. 28, 2013—10 pages.
Extended European Search Report, EP Application No. 12877499.9, dated Nov. 17, 2015, pp. 1-14, EPO.

* cited by examiner

PROVIDING A MODEL OF IMPACT OF A COOLING INFRASTRUCTURE

This application is a PCT national stage application under 35 U.S.C. § 371 of PCT Application No. PCT/US2012/039694, filed May 25, 2012.

BACKGROUND

A data center can include an arrangement of electronic devices, including processing servers, storage servers, communication nodes, and so forth. The electronic devices can be arranged in racks provided in a room (or multiple rooms). To provide temperature control, cooling devices, such as computer room air conditioning (CRAC) units can be provided to manage the cooling of the electronic devices. Adjustable settings associated with the cooling devices can be controlled to provide cooling at specific locations and to a specific degree as needed.

BRIEF DESCRIPTION OF THE DRAWINGS

Some embodiments are described with respect to the following figures.

DETAILED DESCRIPTION

Figure 1:
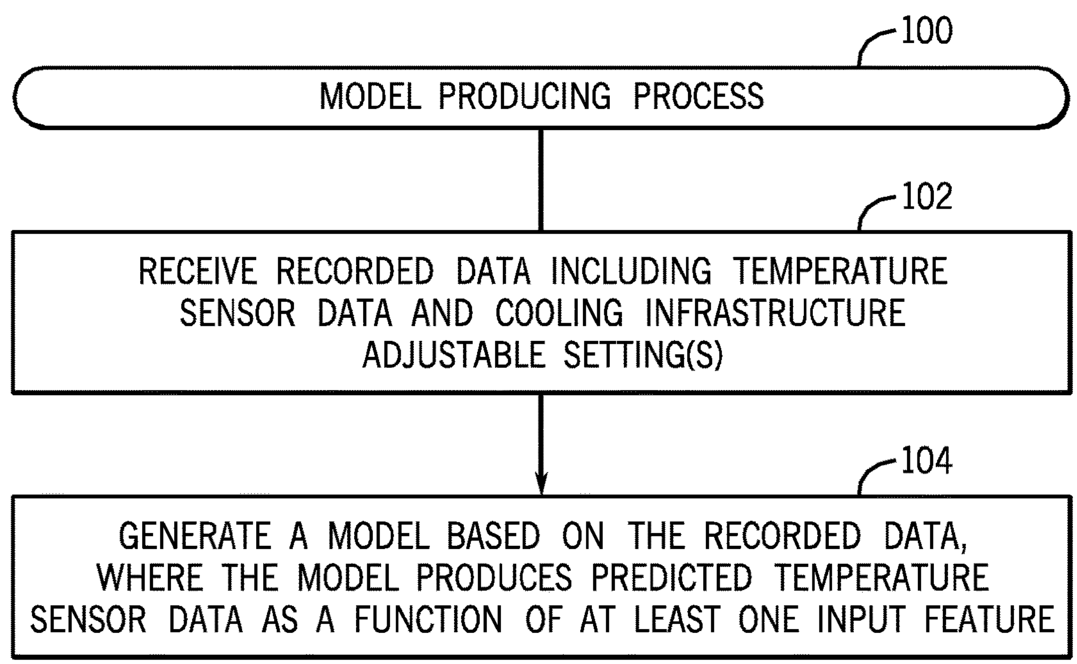
FIG. 1 is a flow diagram of a model producing process according to some implementations.

To efficiently manage the adjustable settings associated with a cooling infrastructure for a data center or any other arrangement of electronic devices (which can include processing servers, storage servers, communication nodes, and so forth), a relationship between the adjustable settings of the cooling infrastructure and the cooling impact at particular locations (of temperature sensors) is derived. The cooling infrastructure can include various cooling devices, such as computer room air conditioning (CRAC) units or other types of cooling devices. A cooling device can have one or multiple adjustable settings. Examples of adjustable settings of a cooling device include one or any combination of the following: a temperature setting of the cooling device (which controls the output or supply air temperature of the cooling device), a blower speed (which specifies a speed of a blower of the cooling device), and so forth. An example of the blower speed is the blower variable frequency drive (VFD) speed.

The cooling infrastructure can also include conduits (such as plenums below a raised floor or other types of airflow conduits) to direct cold air from cooling devices to the electronic devices. In some examples, conduits can be associated with one or multiple adjustable settings. An example of such an adjustable setting can include an adjustable opening in the tile of a raised floor on which the electronic devices are supported. Such openings are referred to as vent tile openings.

There can be other adjustable settings associated with the cooling infrastructure in other examples.

A cooling infrastructure can consume a relatively large amount of energy in a data center. As a result, it is desirable to efficiently manage the cooling infrastructure to provide cooling to the extent needed (in terms of location, time, and amount of cooling). Temperature sensors are provided at various locations to make temperature measurements. In response to the measured temperatures, the adjustable settings of the cooling infrastructure can be controlled to provide the requisite cooling.

To efficiently manage the cooling infrastructure in response to the temperature measurements, the relationship between adjustable settings of a cooling infrastructure and the cooling impact at temperature sensor locations is derived. In some examples, such relationship is manually generated. Manual generation of such relationship can be a time-consuming and disruptive process, since each cooling device is independently perturbed with the response at each temperature sensor location measured.

In accordance with some implementations, data-centric machine-learning based techniques or mechanisms are provided for determining a relationship between cooling infrastructure adjustable settings and cooling impact at respective temperature sensor locations. In some implementations, the relationship can be expressed using thermal correlation indexes (TCIs). A TCI is a measure of a relationship between a change in temperature at a specific temperature sensor (or temperature sensor location) and a corresponding change in an adjustable setting (or group of adjustable settings) of a component of a cooling infrastructure.

In other implementations, instead of or in addition to determining a relationship between cooling infrastructure adjustable settings and temperature, a relationship can be determined between cooling infrastructure adjustable settings and another parameter, such as pressure, relative humidity, and so forth. Thus, more generally, a "correlation index" can be determined that is a measure of a relationship between a change in a parameter (or multiple parameters), such as temperature, pressure, relative humidity, and so forth, and a corresponding change in an adjustable setting (or group of adjustable settings).

In the ensuing discussion, although reference is made to TCI, temperature sensor data, and temperature sensors, it is noted that techniques or mechanisms as described are also applicable in the context of other parameters and use of other types of sensors.

TCI values can be used for identifying, for any given temperature sensor location, which of multiple cooling devices have an influence on the given temperature sensor location. For example, a first cooling device that is relatively close to the given temperature sensor locations would likely have a greater influence on a temperature at the given temperature sensor location than a second cooling device that is located farther away from the given temperature sensor location. Thus, using TCI values, regions of influence for each of the cooling devices can be determined. The determined TCI values and regions of influence can be used by a controller for efficiently managing a cooling infrastructure in response to temperature measurements from temperature sensors.

The machine learning-based techniques or mechanisms according to some implementations involve plural stages. A first of the plural stages produces a model for each temperature sensor location, where the model produces predicted temperature sensor data as a function of at least one input feature that includes an adjustable setting (or multiple adjustable settings) of the cooling infrastructure. A second of the plural stages uses models generated for respective temperature sensors (or temperature sensor locations) for deriving TCI values and regions of influence of cooling devices. Non-intrusive techniques or mechanisms (that do not involve actual perturbations of cooling infrastructure adjustable settings for measuring impact at temperature sensor locations) are thus provided to determine a relationship between cooling infrastructure adjustable settings and cooling impact at respective temperature sensor locations.

FIG. 1 is a flow diagram of a process 100 of producing a model according to some implementations (first stage noted above). The process 100 receives (at 102) recorded data (historical data that was previously recorded), where the recorded data includes temperature sensor data (collected by one or multiple temperature sensors) and an adjustable setting (or multiple adjustable settings) of a cooling infrastructure. Examples of the adjustable settings include a temperature setting of a cooling device, a blower speed of the cooling device, a setting of an adjustable opening associated with an airflow conduit, and so forth. In other examples, the recorded data can instead or additionally include sensor data for another parameter, such as pressure, relative humidity, and so forth.

The process 100 generates (at 104) a model of an impact of the cooling infrastructure based on the recorded data, where the model produces predicted temperature sensor data as a function of at least one input feature that includes an adjustable setting (or adjustable settings) of the cooling infrastructure. More generally, the model produces predicted sensor data (temperature, pressure, relative humidity, etc.) as a function of the at least one input feature.

In some examples, the model does not assume a linear relationship between sensor data and adjustable settings of the cooling infrastructure. In fact, the model is able to model a non-linear relationship between predicted sensor data and an adjustable setting. In some implementations, a separate model can be generated for each sensor (or sensor location).

In further implementations, discussed further below, instead of generating just one model for each sensor location, an ensemble of multiple models can be generated for each sensor location.

Figure 2:
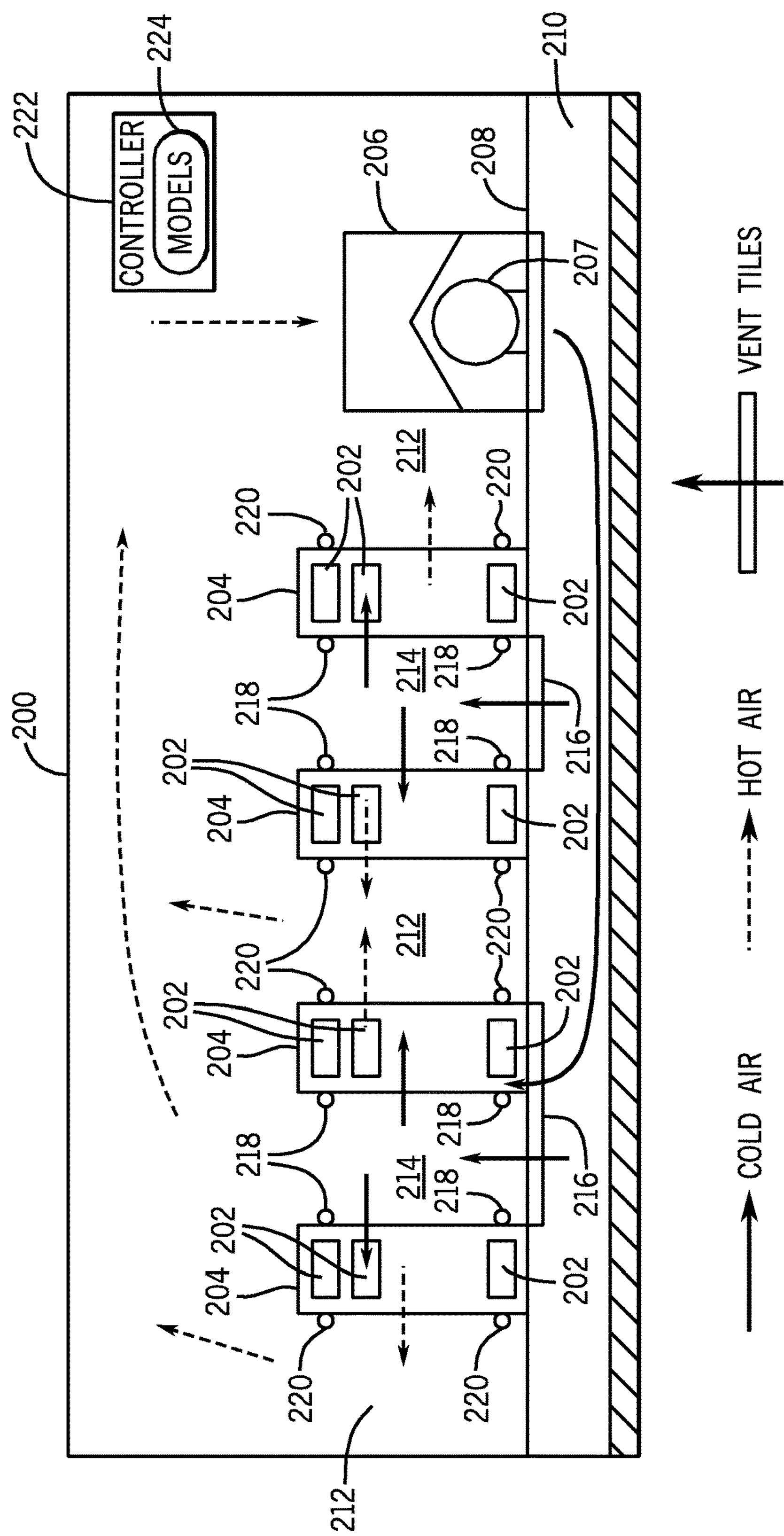
FIG. 2 is a schematic diagram of an example data center having racks of electronic devices, and a controller according to some implementations.

FIG. 2 is a schematic diagram of an example arrangement, which can be part of a data center that includes various electronic devices 202. The electronic devices 202 are arranged in multiple racks 204, where a rack can refer to a support structure for holding a respective collection of electronic devices 202. The racks 204 can be arranged inside a room 200, which can also include a cooling device 206. Although just one cooling device 206 is depicted in FIG. 2, note that there can be additional cooling devices. In other examples, the cooling device 206 can be located outside the room 200.

The cooling device 206 has a blower 207 (for generating airflow). Adjustable settings associated with the cooling device 206 include an adjustable blower speed of the blower 207, and an adjustable output or supply temperature of cold air output from the cooling device 206.

The room 200 has a raised floor 208 on which the racks 204 are supported. The raised floor 208 allows for a plenum 210 to be provided underneath the raised floor 208. The plenum 210 can be used for communicating cold air from the cooling device 206 to the racks 204. In other examples, other types of airflow conduits can be used for directing cold air from the cooling device 206 to the racks 204.

Note that FIG. 2 depicts one type of data center that has the raised floor 208 and that has a generally open environment. There can be other designs for which techniques or mechanisms according to some implementations are applicable, such as contained environments, pods, non-raised floor environments with cool air delivered from above, and so forth.

The racks 204 can be arranged in multiple rows, such that cold and hot aisles are provided. In the example of FIG. 2, the hot aisles are represented as 212, while the cold aisles are represented as 214. Cold air in the plenum 210 is directed through vent tiles 216 in the raised floor 208 into the cold aisles 214. The cold air (represented by solid arrows) are directed into the racks 204. Hot air (represented by dashed arrows) exit from the racks 204, and is drawn back to the cooling device 206, as indicated by the various dashed arrows in FIG. 2.

The racks 204 can be associated with various temperature sensors, including sensors at the input side and output side of each rack. Temperature sensors at the input side are labeled as 218, while sensors at the output side are labeled as 220. In other implementations, temperature sensors can be provided at other locations. More generally, the sensors 218 and 220 can provide measurements of any one or combination of parameters, such as temperature, pressure, relative humidity, and so forth.

FIG. 2 also depicts a controller 222 according to some implementations. In some examples, the controller 222 can be used to perform the process 100 of FIG. 1 for producing models 224 for temperature sensor locations. The controller 222 is also able to use the models 224 for determining a relationship between cooling infrastructure adjustable settings and temperature sensor locations (or more generally sensor locations). Such relationship can be used by the controller 222 for managing the cooling device 206 (such as by making adjustments of the adjustable settings of the cooling device 206). In the examples where the vent tiles 216 have adjustable openings, the controller 222 can also control the openings of the vent tiles 216.

Figure 3:
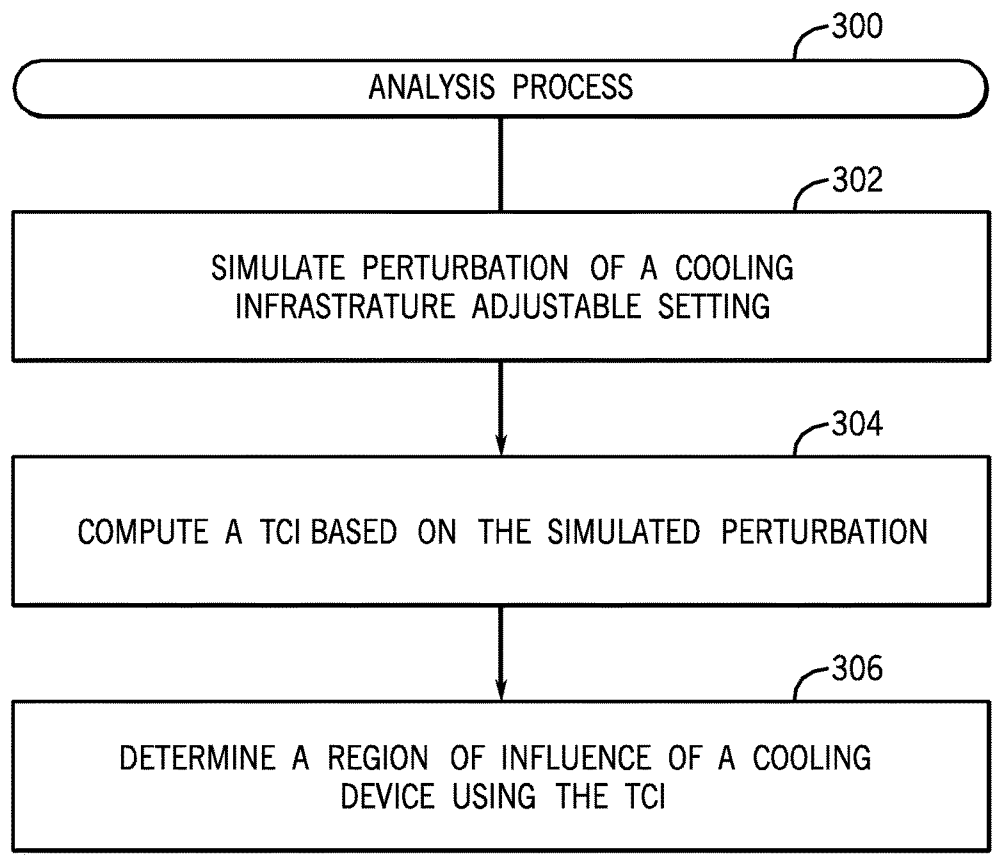
FIG. 3 is a flow diagram of an analysis process according to some implementations.

FIG. 3 is a flow diagram of an analysis process 300 for deriving a TCI and a region of influence, in accordance with some implementations (second stage noted above). The process 300 can be performed by the controller 222 of FIG. 2. The process 300 simulates (at 302) perturbation of an adjustable setting of a cooling infrastructure (such as an adjustable setting of the cooling device 206) using a model (224) that produces predicted temperature sensor data as a function of the perturbed adjustable setting.

The process 300 next computes (at 304) a TCI based on the simulated perturbation, where the TCI relates a change in temperature at a temperature sensor to a corresponding change in the adjustable setting. To compute the TCI, a local slope of a predicted output from the model is determined with respect to a particular value of an adjustable setting. The adjustable setting is varied around the particular value in relatively small increments—the incremental adjustable setting values are provided to the model to produce respective predicted temperature values. A linear function is fitted through the predicted temperature values—this linear function is used to determine the slope, which is used for deriving the TCI.

It is noted that, in accordance with some implementations, TCI is not assumed to be constant throughout different values of an adjustable settings. In other words, it is possible that the slopes at corresponding local ranges of adjustable setting values can differ.

Next, using the TCI, the process 300 determines (at 306) a region of influence of a given cooling device, such as the cooling device 206 of FIG. 2. As discussed further below, a clustering technique can be used for determining a region of influence of a given cooling device.

Although FIG. 3 refers to the use of a model and the computation of a TCI, note that the process 300 can also simulate perturbation of multiple adjustable settings of the cooling infrastructure using respective models. Moreover, multiple TCIs can also be computed for respective temperature sensors. These TCIs can then be used for determining the regions of influence of corresponding cooling devices of the cooling infrastructure.

More generally, the analysis process 300 can be applied to derive a correlation index and a region of influence.

Generating a model (such as performed at 104 in FIG. 1) involves building the model based on a training data set, which can be part of historical recorded data (such as that received at 102 in FIG. 1). The historical recorded data can be divided into a training data set and a test data set, where the training data set is used for building the model, while the test data set is used for testing the trained model to determine an accuracy of the trained model.

In some examples, a model for producing predicted temperature sensor data as a function of at least one adjustable setting can be a tree-based model, such as a regression tree. Regression trees can be relatively flexible; for example, they can handle different kinds of inputs (continuous, discrete, categorical, etc) and perform relatively well with missing data. In other examples, other types of models can be used.

A regression tree can predict a continuous-valued output, Y (temperature sensor data), based on at least one input feature, which can be represented as $X_1, X_2, \ldots X_n$, where n ($n \geq 1$) represents a number of features, and $X_i$ can represent any of the following adjustable settings: temperature setting of a cooling device, blower speed, vent tile opening setting, or other actuator settings. An "actuator setting" can refer to any adjustable setting of a cooling infrastructure. The regression tree is able to model a non-linear relationship between the output Y and any of the input features $X_1, X_2, \ldots X_n$.

Figure 4:
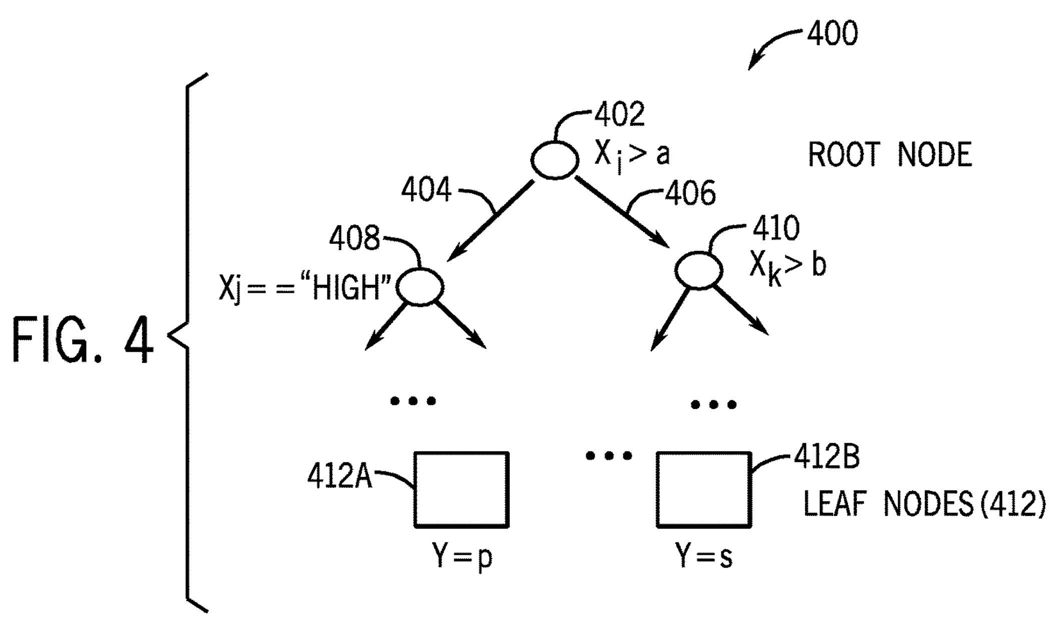
FIG. 4 illustrates a regression tree model according to some examples.

In some implementations, a regression tree can include a binary tree of nodes, such as a regression tree 400 shown in FIG. 4. The regression tree 400 has a root node 402, intermediate nodes 408, 410, and leaf nodes 412.

At each root or intermediate node of the regression tree 400, a variable test can be performed to determine which branch to take from the node. In the example of FIG. 4, the root node 402 performs the following test: a determination of whether the input feature $X_i$ is greater than a. If so, the right branch 406 is taken; if not, the left branch 404 is taken.

In the regression tree 400, the intermediate node 408 tests whether the feature $X_j$ has the value "high," and the intermediate node 410 tests whether the feature $X_k$ is greater than b. Depending on these tests, corresponding branches are taken until leaf nodes 412 are reached. Each leaf node corresponds to a respective output value for Y (temperature sensor data). For example, a first leaf node 412A sets Y=p, and a second leaf node 412B sets Y=s.

More generally, given an input collection of features (which can be in the form of an input feature vector), the prediction of the temperature sensor data using the regression tree 400 involves starting at the root node 402 and proceeding through intermediate nodes, and applying respective tests at each of the root and intermediate nodes until a leaf node is reached. The input feature vector has corresponding different values for the different features, and such values are tested at the respective root node and intermediate nodes of the regression tree to reach a particular leaf node.

To train a regression tree, the input space (training data set) is recursively partitioned based on respective features until a relatively small number of training data points remain in a partition (this relatively small number of training points correspond to a respective leaf node and is used to produce a value for Y). In some examples, the value of Y at each leaf node can be a constant value that is the average (or other aggregate) of the training data points corresponding to the leaf node.

Training of a regression tree based on a training data set can cause overfitting of the regression tree in some scenarios. To address issues relating to overfitting training data onto a particular regression tree, some implementations can use an ensemble of regression trees (more generally an ensemble of models) for each temperature sensor location. Using the models in the ensemble, multiple predicted temperatures of a temperature sensor can be produced based on the corresponding different models of the ensemble. These predicted temperatures can then be aggregated (e.g. by computing an average, a weighted average, a median, a maximum, a minimum, etc.) to produce an output predicted temperature to be used as the predicted output of the temperature sensor.

In some examples, a random forests technique can be used for producing multiple models for a given temperature sensor. In other examples, other ensemble learning techniques can be used, such as boosting, bagging, stacking, and so forth.

With the random forests technique, multiple regression trees can be created from a training data set. With the random forests technique, two mechanisms are provided to reduce correlation between individual models in an ensemble. First, to train corresponding regression trees of the ensemble, respective different bootstrap samples are selected—use of different bootstrap samples results in slightly different training data for each regression tree. Second, to provide randomness, a randomly chosen subset of features can be used at each split in a regression tree during the training of the regression tree.

Selecting a bootstrap sample from a training data set refers to randomly picking some number of data points with replacement from the training data set, where a "data point" includes input feature(s) (values of one or multiple cooling infrastructure adjustable settings) and a corresponding output (temperature sensor data). The bootstrap sample is then used to fit (train) a regression tree. By selecting just a subset of data points from the training data set, the remainder of the data can be considered "out-of-bag data" (or test data) that can be used for testing of a trained regression tree. For each regression tree, the error of the regression tree can be computed based on the out-of-bag data set.

In addition to the above, feature selection can also be used in some implementations to whittle down the number of features to the most relevant ones. Reducing the number of features can result in less complexity, less chances of overfitting, and so forth. Feature selection techniques include subset selection, regularization, correlation-based selection, entropy-based selection, and so forth. After feature selection is performed, the models, e.g. regression trees, can be trained.

Figure 5:
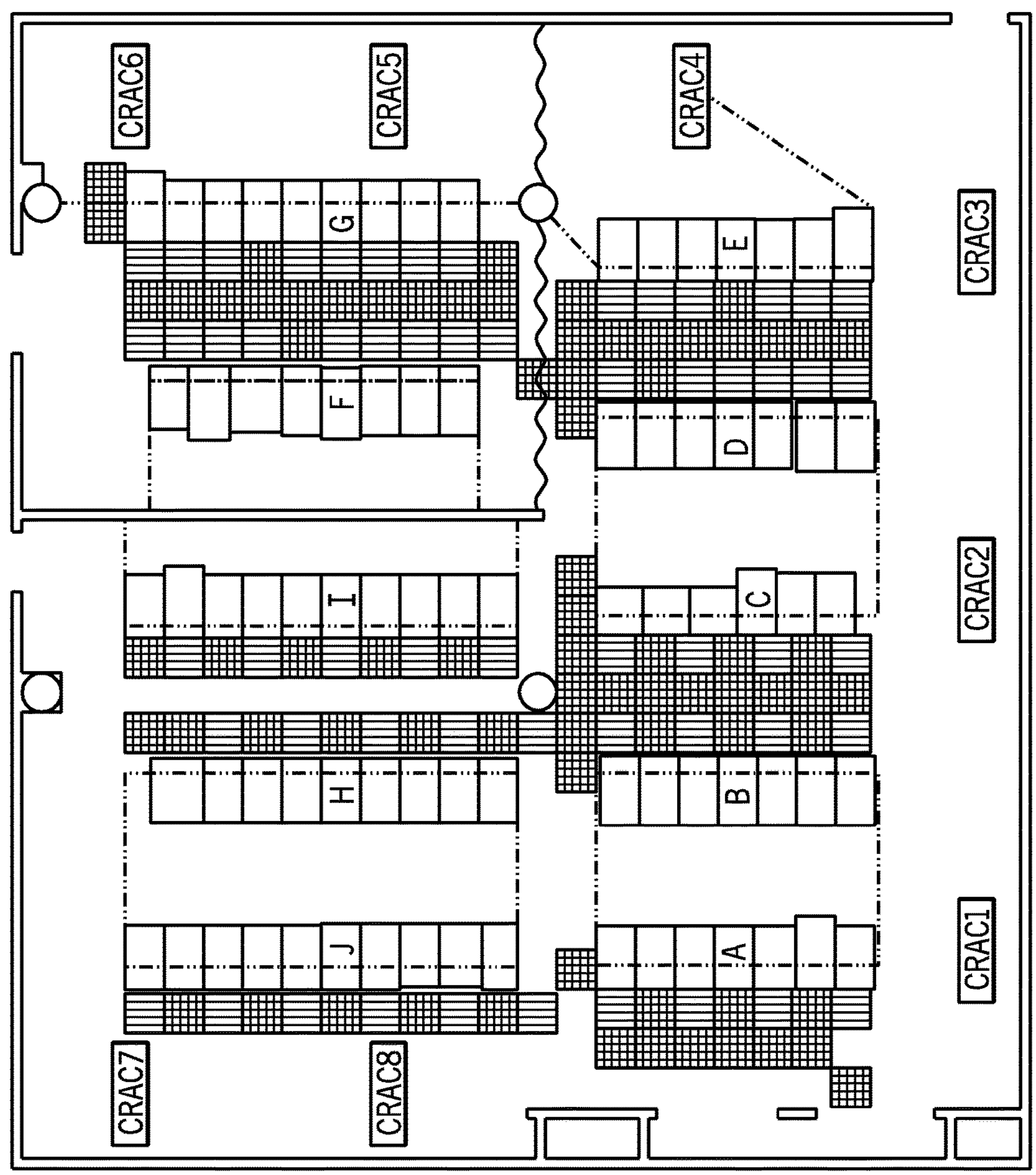
FIG. 5 illustrates an example layout of a data center.

FIG. 5 shows an example layout of racks and cooling devices. The cooling devices are labeled as CRAC1 to CRAC8 in the example. The various racks of electronic devices that are in the layout of FIG. 4 are arranged in multiple rows of racks, where the rows are labeled A, B, C, D, E, F, G, I, and J. Temperature sensor data can be collected by temperature sensors mounted at the inlets and outlets of racks depicted in FIG. 5.

Figure 6:
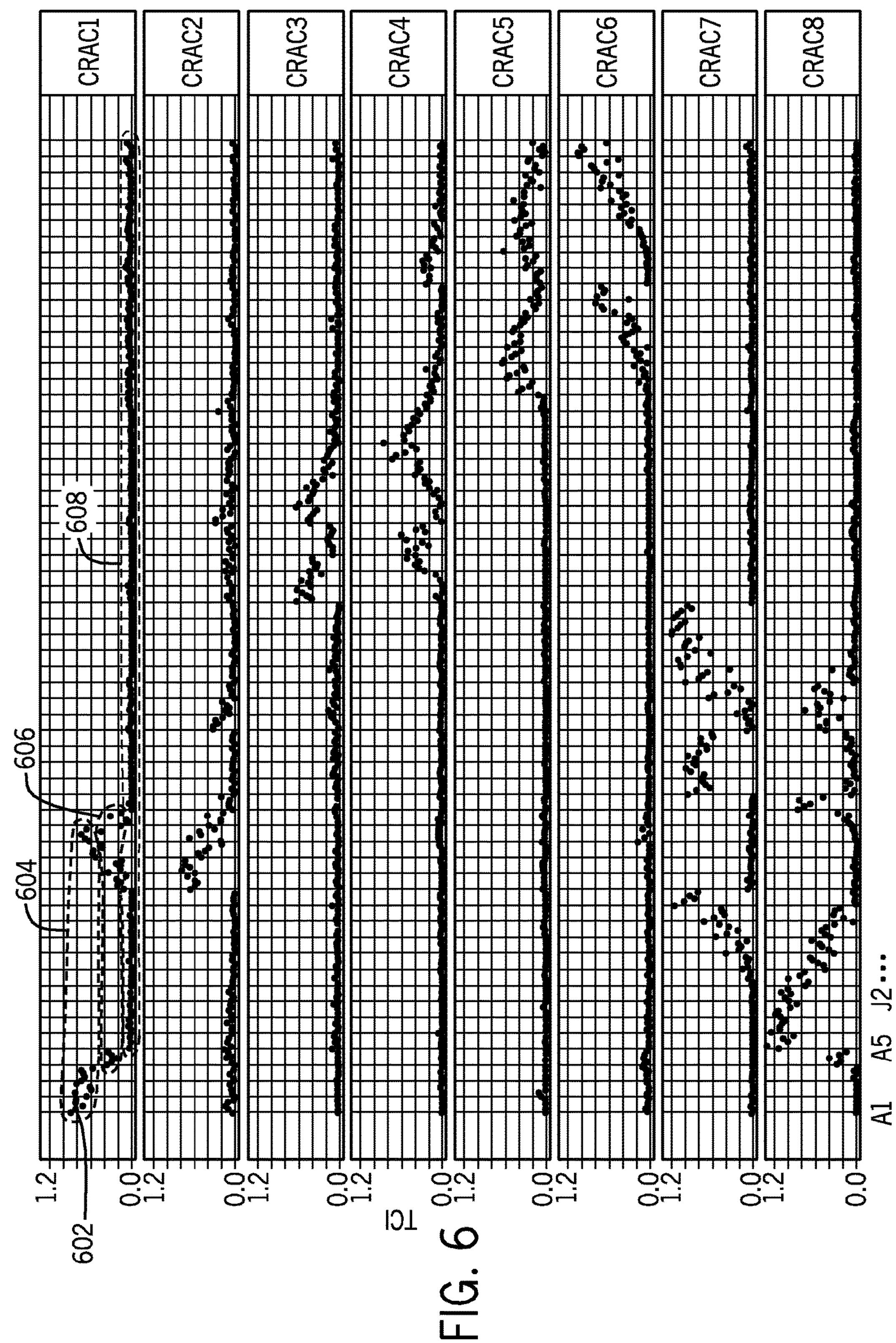
FIG. 6 is a graph illustrating thermal correlation indexes as a function of temperature sensors, generated according to some implementations.

FIG. 6 depicts TCI values (along the vertical axis) with respect to the supply air temperature (SAT) for each cooling device (CRAC1 to CRAC8) as a function of temperature sensors (horizontal axis). For example, a point 602 represents the TCI value that correlates the temperature sensor data of a temperature sensor A1 to adjustable setting(s) of the cooling device CRAC1.

To compute a region of influence for each of the cooling devices, clustering of the TCI values can be performed. For example, for TCI values associated with the cooling device CRAC1, three clusters 604, 606, and 608 can be identified. The clustering generally attempts to generate dusters of TCI values that are closer to each other than TCI values in the other clusters. Examples of clustering techniques that can be used include any one of the following: K-means clustering, K-medoids clustering, hierarchical clustering, and so forth.

Figure 7:
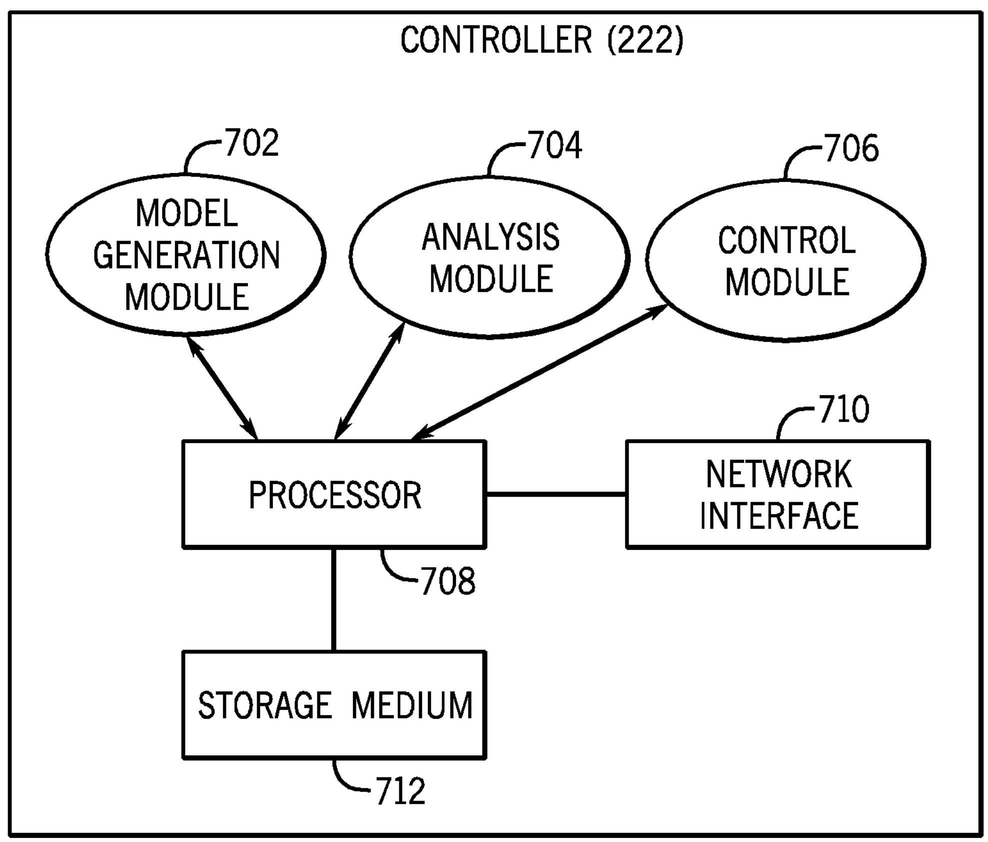
FIG. 7 is a block diagram of an example system that incorporates some implementations.

FIG. 7 is a block diagram of an example arrangement of the controller 222 of FIG. 2. The controller 222 can include a model generation module 702 for building models according to some implementations. The model generation module 702 can perform the process 100 of FIG. 1, for example. The controller 222 can also include an analysis module 704 to perform the analysis process 300 of FIG. 3, for example.

The controller 222 can also include a control module 706 for controlling adjustable settings of a cooling infrastructure. The control can be based on the determined TCI values as well as the determined regions of influence of respective cooling devices. Based on temperature measurements by the various temperature sensors of an arrangement of electronic devices, the control module 706 can use the TCI values and regions of influence to adjust adjustable settings of the cooling infrastructure.

The model generation module 702, analysis module 704, and control module 706 can be machine-readable instructions that are executable on one or multiple processors 708. The processor(s) 708 can be connected to a network interface 710 (to allow the controller 222 to communicate over a data network), and a storage medium (or storage media) 712 (to store data).

Although the various modules 702, 704, and 706 are depicted as being part of the same controller 222, note that in alternative implementations, the modules can be implemented on separate machines.

The storage medium (or storage media) 712 can be implemented as one or more computer-readable or machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A method executed by a system having a processor, comprising:

receiving recorded data including sensor data and an adjustable setting of a cooling infrastructure;

generating a model of impact of the cooling infrastructure based on the recorded data, where the model produces predicted sensor data as a function of at least one input feature that includes the adjustable setting, and where the model is able to model a non-linear relationship between the predicted sensor data and the adjustable setting, wherein the model is for a particular sensor;

generating another model based on the recorded data, where the another model produces predicted sensor data output by the particular sensor as a function of the at least one input feature, wherein the models are part of an ensemble of models for the particular sensor;

using the models in the ensemble to produce respective predicted measurements from the particular sensor; and aggregating the predicted measurements to produce an output predicted sensor data for the particular sensor.

2. The method of claim 1, wherein the adjustable setting is selected from among a temperature setting of a cooling device in the cooling infrastructure, a blower speed of a cooling device in the cooling infrastructure, and a setting of an adjustable opening associated with an airflow conduit in the cooling infrastructure.

3. The method of claim 1, wherein the sensor data is selected from among temperature sensor data, pressure sensor data, and relative humidity sensor data.

4. The method of claim 1, further comprising:

computing a correlation index using the model, where the correlation index relates a change in a parameter at a sensor to a corresponding change in the adjustable setting.

5. The method of claim 4, wherein computing the correlation index comprises computing a thermal correlation index.

6. The method of claim 5, further comprising:

determining a region of influence of a cooling device in the cooling infrastructure based on the thermal correlation index.

7. The method of claim 1, further comprising adjusting, by the system based on the predicted sensor data for the particular sensor, the adjustable setting of the cooling infrastructure.

8. The method of claim 1, wherein the adjustable setting of the cooling infrastructure is an adjustable setting of an adjustable opening of a floor vent tile through which cooling air passes from a plenum underneath a floor to equipment above the floor.

9. The method of claim 1, wherein using the models in the ensemble to produce the respective predicted measurements comprises using the models in the ensemble to produce respective predicted temperatures from the particular sensor, and wherein aggregating the predicted measurements to produce the output predicted sensor data for the particular sensor comprises aggregating the predicted temperatures.

10. The method of claim 1, wherein the aggregating comprises computing one of an average, a median, a maximum, or a minimum of the predicted measurements to produce the output predicted sensor data for the particular sensor.

11. An article comprising at least one non-transitory machine-readable storage medium storing instructions that upon execution cause a system to:

simulate perturbation of an adjustable setting of a cooling infrastructure using a plurality of different models that produce respective predicted temperatures for an individual sensor as a function of the adjustable setting, the simulating aggregating the respective predicted temperatures output by the plurality of different models to produce an aggregate predicted temperature for the individual sensor; and determine a relationship between the adjustable setting and temperatures of the individual sensor based on the simulated perturbation; and control adjustment of the adjustable setting of the cooling infrastructure based on the determined relationship.

12. The article of claim 11, wherein determining the relationship includes computing a thermal correlation index that relates a change in a temperature at the individual sensor to a corresponding change in the adjustable setting.

13. The article of claim 11, wherein the simulating comprises simulating perturbations of adjustable settings of cooling devices in the cooling infrastructure, and wherein the instructions upon execution cause the system to compute correlation indexes for corresponding plural sensors based on the perturbations.

14. The article of claim 11, wherein the plurality of different models comprise regression trees, and wherein the instructions upon execution cause the system to further train the regression trees using recorded data including measurements at a plurality of sensors, and corresponding adjustable settings of cooling devices in the cooling infrastructure.

15. The article of claim 11, wherein the aggregating comprises computing one of an average, a median, a maximum, or a minimum of the predicted temperatures to produce the aggregate predicted temperature for the individual sensor.

16. A system comprising:

at least one processor to:

receive recorded data including measurement data of a sensor, and an adjustable setting of a cooling infrastructure;

generate a plurality of different models for the sensor based on the recorded data, where each of the plurality of different models produces a respective predicted sensor data as a function of an input feature that includes the adjustable setting, and where at least a given one of the plurality of different models is able to model a non-linear relationship between a respective predicted sensor data and the adjustable setting;

aggregate the respective predicted sensor data produced by the plurality of different models to compute an output predicted sensor data for the sensor, the aggregating comprising computing one of an average, a median, a maximum, or a minimum of the respective predicted sensor data produced by the plurality of different models; and control adjustment of the adjustable setting of the cooling infrastructure based on the output predicted sensor data for the sensor.

17. The system of claim 16, wherein the at least one processor is to further:

generate a thermal correlation index for the sensor using the output predicted sensor device; and determine a region of influence of a cooling device of the cooling infrastructure using the thermal correlation index.

18. The system of claim 16, wherein the respective predicted sensor data produced by the plurality of different models comprise respective predicted temperatures for the sensor, and wherein the aggregating of the respective predicted sensor data produced by the plurality of different models to compute the output predicted sensor data for the sensor comprises aggregating the respective predicted temperatures.

* * * * *